United States Patent [19]
Chen et al.

[11] Patent Number: 5,242,770
[45] Date of Patent: Sep. 7, 1993

[54] MASK FOR PHOTOLITHOGRAPHY

[75] Inventors: Jang F. Chen, San Jose; James A. Matthews, Milpitas, both of Calif.

[73] Assignee: MicroUnity Systems Engineering, Inc., Sunnyvale, Calif.

[21] Appl. No.: 821,793

[22] Filed: Jan. 16, 1992

[51] Int. Cl.[5] ............................................. G03F 9/00
[52] U.S. Cl. ....................................... 430/5; 378/35; 364/474.24
[58] Field of Search ............................ 430/5; 378/35; 364/474.24

[56] References Cited

U.S. PATENT DOCUMENTS 4,895,780 1/1990 Nissan-Cohen et al. ................ 430/5

OTHER PUBLICATIONS

Chien, Paul et al.; "Proximity Effects in Submicron Optical Lithography": pp. 35-39, SPIE vol. 772 Optical Microlithography VI (1987).
Rosenbluth, Alan E. et al.; "A Critical Examination of Submicron Optical Lithography Using Simulated Projection Images": pp. 1190-1195, J. Vac. Sci. Technol. B., vol. 1 No. 4, Oct-Dec. 1983.
Nissan-Cohen, Y. et al.; "Variable Proximity Corrections for Submicron Optical Lithographic Masks": pp. 13-14, Proc. 1987 Symp. VLSI Tech. (1987).
Meyerhofer, Dietrich; "Resolution and Proximity Effect in Optical Lithography": pp. 174-187, SPie vol. 922 Optical/Laser Microlithography (1988).
Shamma, Nader et al.; "A Method for Correction of Proximity Effect in Optical Projection Lithography": pp. 145-156, Proc. KTI Interface (1989).
Liu, Albert C. et al.; "A Study of Projected Optical Images for Typical IC Mask Patterns Illuminated by Partially Coherent Light": pp. 1251-1263, IEEE Transations on Electron Devices, vol. ED-30, No. 10, Oct. 1983.
Maxwell, Graeme D.; "An Analysis of the Relevance to Linewidth Control of Various Aerial Image Characteristics": pp. 213-223, SPIE vol. 633 Optical Microlithography V (1986).
Ong, Edith et al.; "Comparison of Proximity Effects in Contrast Enhancement Layer and Bi-layer Resist Processes": pp. 443-448, J. Vac. Sci. Technol. B 5(1), Jan/Feb 1987.
Flanner III, Philip D. et al.; "Two-Dimensional Optical Proximity Effects": pp. 239-244, SPIE vol. 633 Optical Microlithography V (1986).
Dunbrack, Steve K.; "Masks for Sub-0.5 micron Optical Lithography": pp. 2-8, SPIE vol. 922 Optical/Laser Microlithography (1988).
Wolf, T. M. et al.; "Proximity Effects of Lithography and Etching in Submicron Processes": pp. 335-349, Proc. KTI Interface (1989).
White, L. K.; "Contact Hole Imaging in Stepper Lithography", pp. 1-8, SPIE vol. 733 Optical Lithography VI (1987).
Ito et al.; "Submicrometer Pattern Correction for Optical Lithography" pp. 9-17, SPIE vol. 922 Optical/Laser Microlithography (1988).
Starikov, A.; "Use of a Single Size Square Serif for Variable Print Bias Compensation in Microlithography; Method, Design, and Practice", pp. 34-46, SPIE vol. 1088 Optical/Laser Microlithography (1989).

Primary Examiner—Marion E. McCamish
Assistant Examiner—Mark A. Chapman

[57] ABSTRACT

An improvement for reducing proximity effects comprised of additional lines, referred to as intensity leveling bars, into the mask pattern. The leveling bars perform the function of adjusting the edge intensity gradients of isolated edges in the mask pattern, to match the edge intensity gradients of densely packed edges. Leveling bars are placed parallel to isolated edges such that intensity gradient leveling occurs on all isolated edges of the mask pattern. In addition, the leveling bars are designed to have a width significantly less than the resolution of the exposure tool. Therefore, leveling bars that are present in the mask pattern produce resist patterns that completely developed away when a nominal exposure energy is utilized during exposure of photoresist.

18 Claims, 6 Drawing Sheets

FIG_1
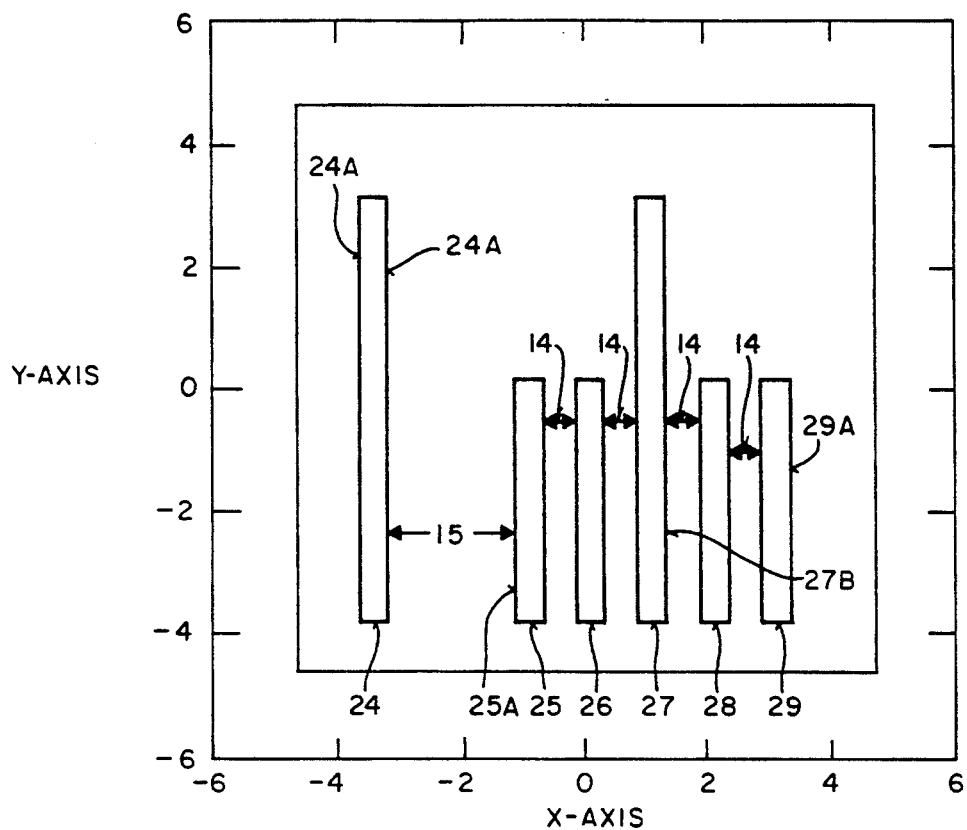
FIG_2
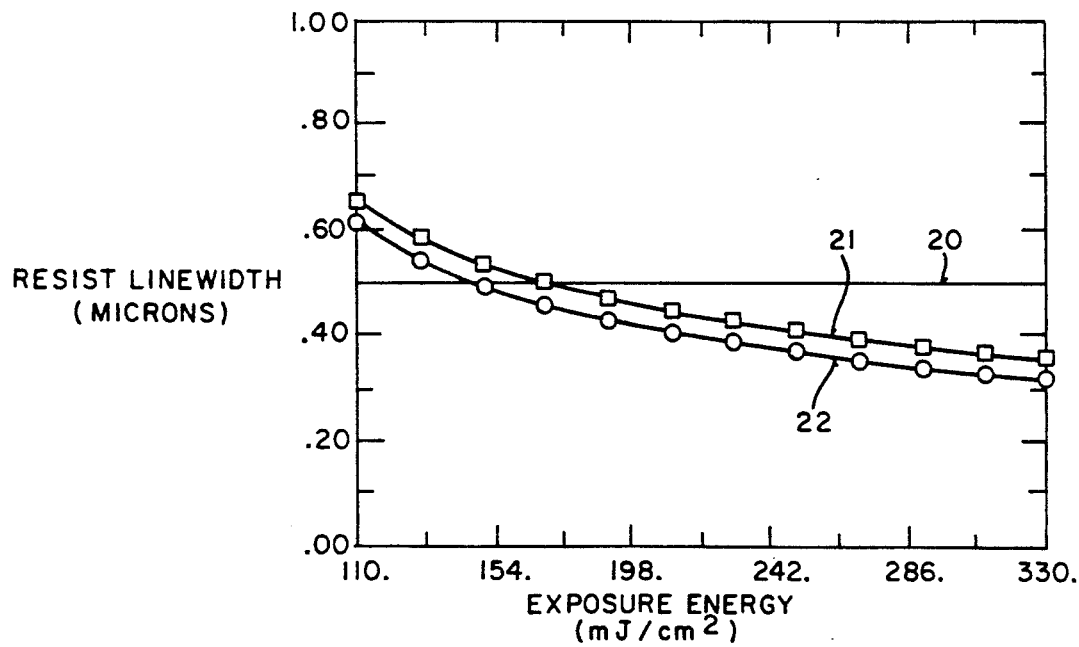

FIG_3
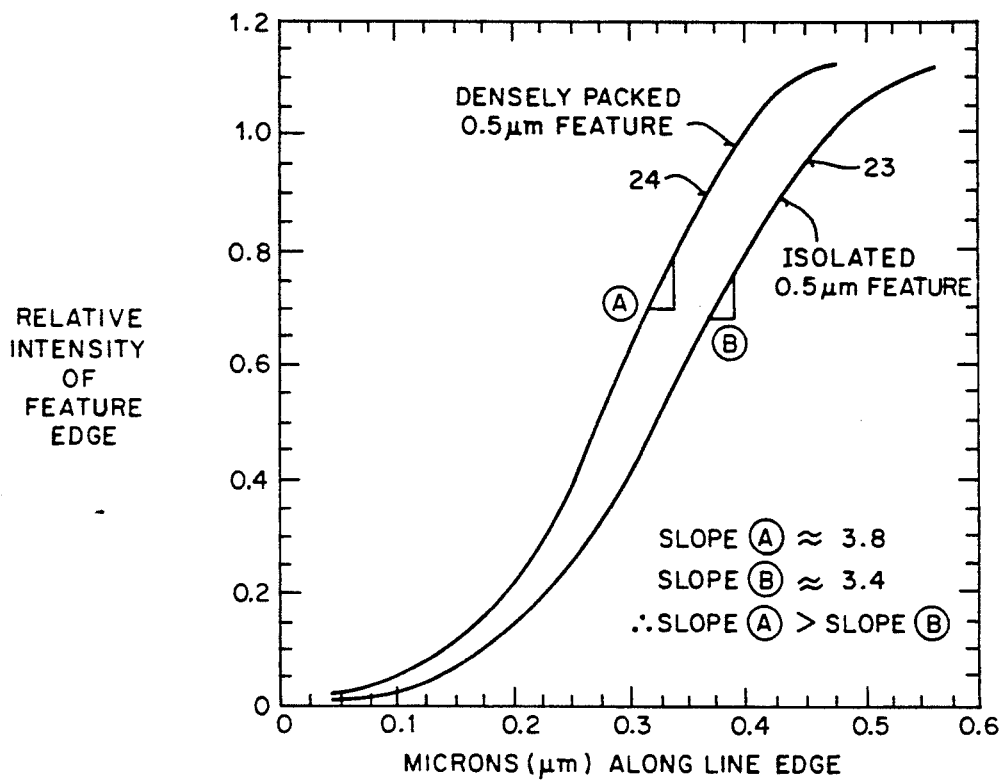
TABLE_4
OPTIMUM DIMENSIONS FOR INTENSITY LEVELING BARS
| DESIGN RULES | MASK TYPE | SIZE OF THE LEVELING BAR | SPACING TO THE NEIGHBORING EDGE |
|---|---|---|---|
| (1) 0.5 MICRONS | CLEAR FIELD MASK: | 0.1 MICRONS | 0.55 MICRONS |
|  | DARK FIELD MASK: | 0.1 MICRONS | 0.50 MICRONS |
| (2) 0.4 MICRONS | CLEAR FIELD MASK: | 0.08 MICRONS | 0.44 MICRONS |
|  | DARK FIELD MASK: | 0.08 MICRONS | 0.40 MICRONS |

FIG_5A
DENSELY, ISOLATED, AND LEVELING FEATURES
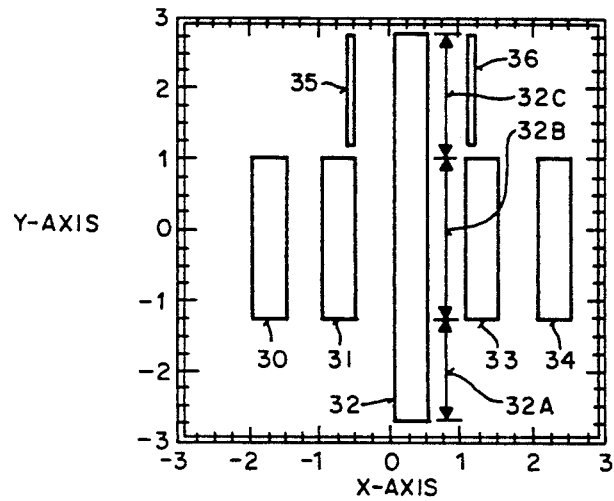
FIG_5B
INTENSITY GRADIENT COMPARISON
(A) ISOLATED, (B) PACKED, (C) LEVELED
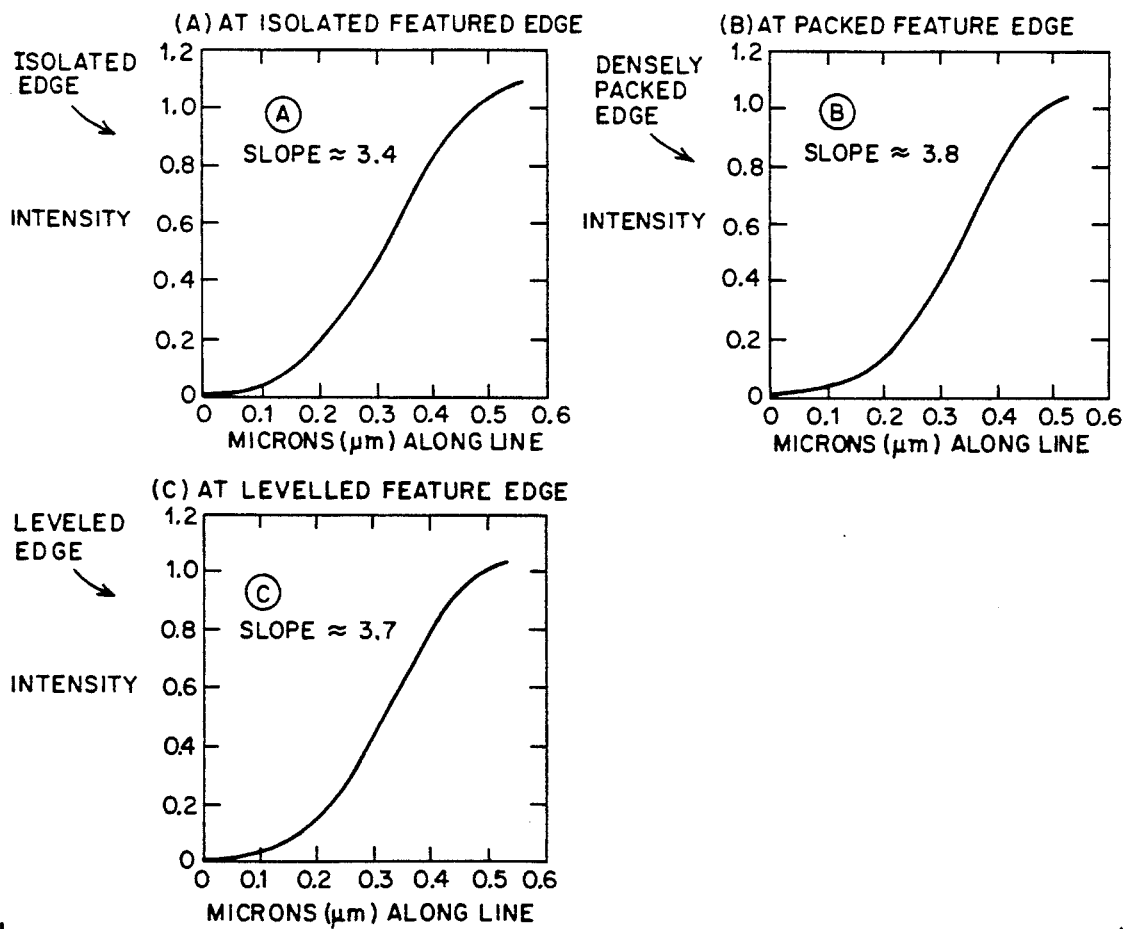

FIG. 6A

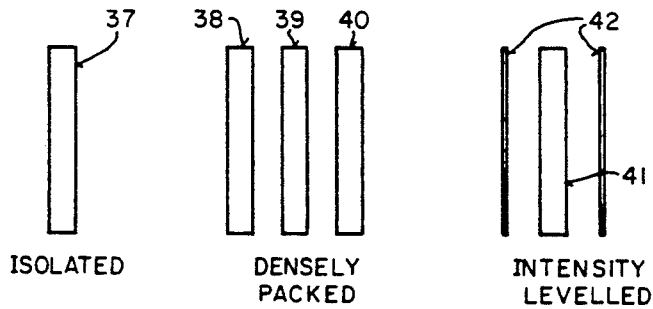

ISOLATED     DENSELY PACKED     INTENSITY LEVELLED

TABLE 6B

| EXPOSURE (mJ) | EDGE INTENSITY LEVELLED FEATURE | | DENSELY PACKED FEATURE | | ISOLATED FEATURE | |
|---|---|---|---|---|---|---|
| | CDs ($\mu$m) | WALL ANGLE (DEGREE) | CDs ($\mu$m) | WALL ANGLE (DEGREE) | CDs ($\mu$m) | WALL ANGLE (DEGREE) |
| 110 | 0.631 | 84.0 | 0.634 | 83.9 | 0.641 | 80.4 |
| 130 | 0.553 | 86.8 | 0.557 | 86.3 | 0.567 | 86.1 |
| 150 | 0.497 | 87.3 | 0.506 | 86.9 | 0.521 | 87.3 |
| 170 | 0.480 | 87.3 | 0.474 | 87.5 | 0.492 | 86.7 |
| 190 | 0.452 | 87.8 | 0.455 | 87.5 | 0.464 | 87.8 |
| 210 | 0.424 | 87.8 | 0.423 | 87.5 | 0.441 | 88.8 |

TABLE 6C

| EXPOSURE (mJ) | ABSOLUTE CD DELTA BETWEEN FEATURES (MICRONS) | | ABSOLUTE WALL ANGLE DELTA BETWEEN FEATURES (DEGREE) | |
|---|---|---|---|---|
| | \|PACKED-LEVELLED\| | \|PACKED-ISOLATED\| | \|PACKED-LEVELLED\| | \|PACKED-ISOLATED\| |
| 110 | 0.003 | 0.007 | 0.1 | 3.5 |
| 130 | 0.004 | 0.010 | 0.5 | 0.2 |
| 150 | 0.009 | 0.015 | 0.4 | 0.4 |
| 170 | 0.006 | 0.018 | 0.2 | 0.8 |
| 190 | 0.003 | 0.009 | 0.3 | 0.3 |
| 210 | 0.001 | 0.018 | 0.3 | 1.3 |
| AVERAGE DELTA | 0.0043 | 0.0128 | 0.3 | 1.08 |

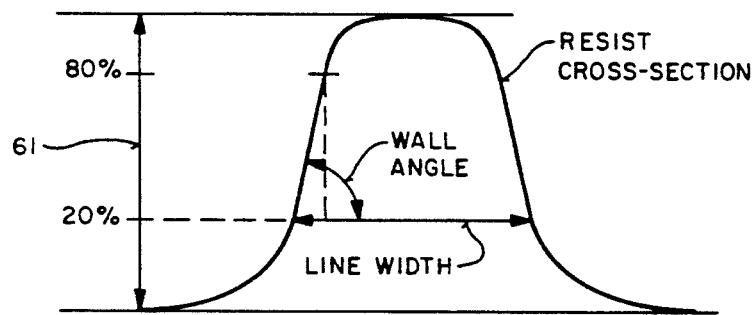
FIG_6D
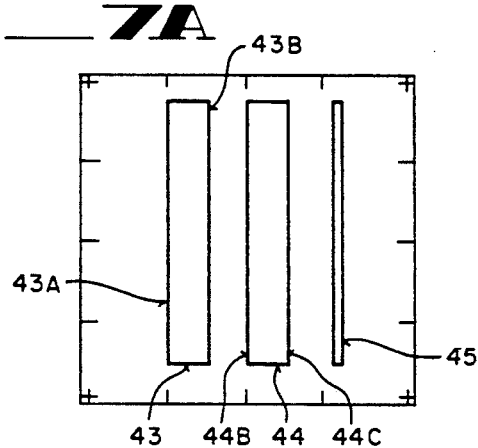
FIG_7A
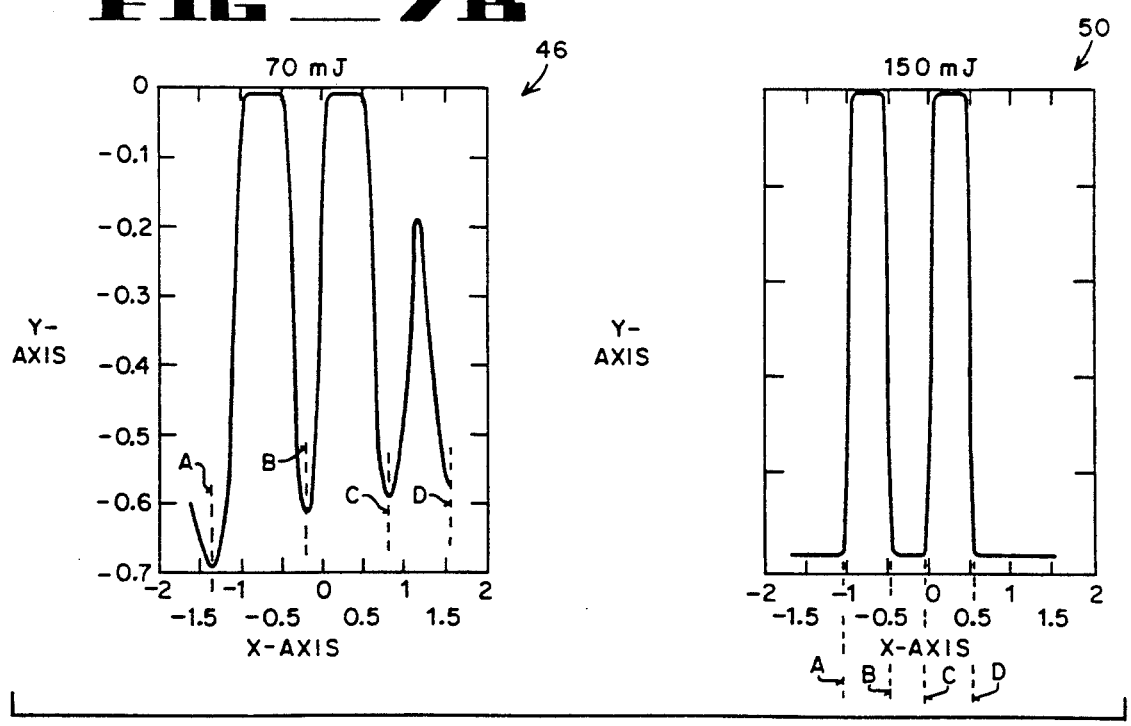
FIG_7B

FIG._8A  CLEAR FIELD MASK
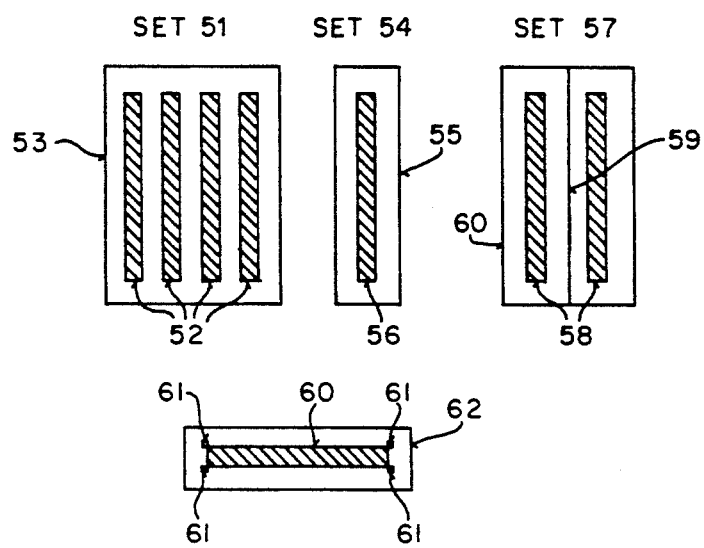
FIG._8B  DARK FIELD MASK
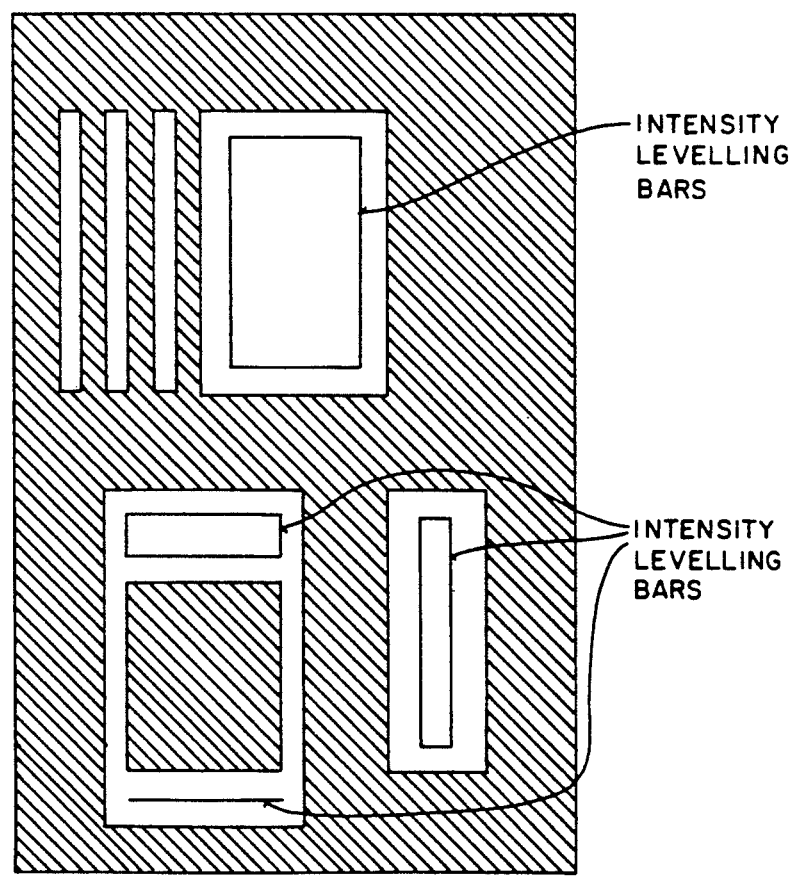

MASK FOR PHOTOLITHOGRAPHY

FIELD OF THE INVENTION

The present invention relates to the field of processing of semiconductor devices, and particularly to photolithographic methods of transferring patterns onto the surface of a silicon substrate.

BACKGROUND OF THE INVENTION

In designing an integrated circuit (IC), engineers typically rely upon computer simulation tools to help create a circuit schematic design consisting of individual devices coupled together to perform a certain function. To actually fabricate this circuit in a semiconductor substrate the circuit must be translated into a physical representation, or layout, which itself can then be transferred onto the silicon surface. Again, computer aided design (CAD) tools assist layout designers in the task of translating the discrete circuit elements into shapes which will embody the devices themselves in the completed IC. These shapes make up the individual components of the circuit, such as gate electrodes, field oxidation regions, diffusion regions, metal interconnections, and so on. The software programs employed by these CAD systems are usually structured to function under a set of predetermined design rules in order to produce a functional circuit. Often, these rules are determined by certain processing and design limitations. For example, design rules defining the space tolerance between devices or interconnect lines so as to ensure that the devices or lines do not interact with one another in any unwanted manner.

Design rule limitations are frequently referred to as critical dimensions. A critical dimension of a circuit is commonly defined as the smallest width of a line or the smallest space between two lines. Consequently, the critical dimension determines the overall size and density of the IC. In present IC technology, the smallest critical dimension for state-of-the-art circuits is 0.5 microns for line widths and spacings.

Once the layout of the circuit has been created, the next step to manufacturing the integrated circuit (IC) is to transfer the layout onto a semiconductor substrate. Photolithography is a well known process for transferring geometric shapes present on a mask onto the surface of a silicon wafer. In the field of IC lithographic processing a photosensitive polymer film called photoresist is normally applied to a silicon substrate wafer and then allowed to dry. An exposure tool is utilized to expose the wafer with the proper geometrical patterns through a mask by means of a source of light or radiation. After exposure, the wafer is treated to develop the mask images transferred to the photosensitive material. These masking patterns are then used to create the device features of the circuit.

An important limiting characteristic of the exposure tool is its resolution value. The resolution for an exposure tool is defined as the minimum feature that the exposure tool can repeatedly expose onto the wafer. Currently, the resolution for most advanced optical exposure tools is around 0.4 micron. Thus, the resolution value of present lithographic equipment is close to the critical dimension for most IC circuit designs. Consequently, the resolution of the exposure tool may influence the final size and density of the IC circuit. As the critical dimensions of the layout becomes smaller and approach the resolution value of the lithography equipment, the consistency between the masked and actual layout pattern developed in the photoresist is significantly reduced. Specifically, it is observed that differences in pattern development of circuit features depends upon the proximity of the features to one another.

Proximity effects in a lithographic process (using optical projection printing) can arise during imaging, resist pattern formation (exposure and development), and subsequent pattern transfer steps such as etching. The magnitude of the effect depends on the proximity or closeness of the two features present on the masking pattern. Proximity effects are known to result from optical diffraction in the projection system. This diffraction causes adjacent features to interact with one another in such a way to produce pattern-dependent variations.

For example, lines designed to have the same dimension, but which are placed in different proximity to other features in a layout (isolated vs. densely packed), will not have the same dimensions after being developed. Thus, a group of densely packed lines tends to transfer differently when compared with an isolated line. Obviously, significant problems can arise in an IC when line widths are not consistently reproduced.

Numerous methods have been developed to overcome the proximity effect problem. CD biasing is one method that has been developed to precompensate certain mask features so that the final target dimensions that are transferred to the wafer are consistent with non-compensated features. As an example, lines having the same width in a mask pattern can have different final resist line widths due to proximity effects. Specifically, it has been found that the final line width for isolated features is larger than that of packed features when utilizing positive optical photoresist. To reduce this inconsistency, IC manufactures designers have created mask patterns in which the original mask line width of the isolated features is smaller than the width of the packed feature. By pre-compensating the mask pattern, the final resist line widths for the isolated and packed features will be approximately the same. Normally, the amount of size increase or biasing is determined empirically and is highly dependent upon the exposure tool used, the type of resist process employed, and size of the critical dimension. Consequently, shifts from these nominal lithographical factors can easily have an adverse impact on the biased features. Therefore, this approach has not been widely adopted in the industry.

In the biasing approach it has also been found that increasing the thickness of the photoresist reduces the impact of the proximity effect caused by the resist process. As a result, at certain resist thicknesses the proximity effect can be minimized for a given exposure tool. The main drawback for varying resist thickness is that the selected resist thickness to produce minimum CD biasing is often not the desired thickness for accomplishing optimum resolution. Thus, CD biasing offers an unsatisfactory solution to proximity effect problems.

A multi-layer resist process is another method suggested for enhancing line width control and reducing proximity effects. This method involves coating a layer of relatively opaque material on top of a photoresist layer or alternatively, using a dyed planarizing layer to eliminate surface topography and reflectivity problems. Though reducing substrate reflectivity somewhat reduces proximity effects, none of the multi-layer resist processes currently in use entirely eliminates proximity problems, and are more expensive than conventional processes.

Still another prior art relies upon the known fact that the illumination coherency for the optical exposure tool can influence proximity effects. It has been recommended that less coherent illumination is more favorable for feature control. However, totally incoherent illumination often loses resolution causing the imaging process to be less than optimum. In addition, since most commercial exposure tools come with a fixed coherence setting, changing the coherency of the tool can be quite involved mechanically and is usually not recommended by the equipment vendor.

Finally, since it has been determined that the nature of proximity effects for electron beam (e-beam) imaging is opposite to that of optical imaging, it has been suggested that auto proximity compensation be utilized to reduce proximity effects. Auto proximity compensation is accomplished by using an e-beam generated 1X (no size reduction) reticle with an optical exposure tool, effectively cancelling out the proximity effects. However, there are many more benefits in applying a reduction exposure method as compared to a non-reduction technique. The most significant benefit is that as critical dimensions become smaller, mask venders are able to manufacture larger feature sized masks with a smaller percentage of errors than masks with smaller feature sizes. Additionally, dimension tolerances in the mask for the reduction exposure method are reduced by the amount of reduction during exposure. Since reduced dimension tolerances generates less device failures, the reduction method increases wafer yield. Consequently, the majority of IC makers today are utilizing a reduction method to produce wafers; making 1X technology less desirable for most applications. Further, auto proximity compensation is only beneficial in certain limited cases.

What is needed is a simpler less process dependent solution which solves the proximity effect problem. As will be seen, the present invention minimizes proximity effects by altering the masking pattern such that edge intensity gradients for isolated features match the edge intensity gradients for densely packed features. Once all features have similar edge intensity gradients, pattern transfer becomes more uniform, and the proximity effect problem is virtually eliminated.

SUMMARY OF THE INVENTION

An improvement for reducing proximity effects during pattern transfer in a semiconductor lithographical process is described. Due to proximity effects, the pattern transfer of specific features in a mask pattern is dependent on their proximity to other features on the mask. For example, lines having the same dimensions on a mask but in different proximity to other features will not have the same dimensions after being transferred and developed onto the semiconductor. This proximity effect is caused by the intensity gradient at a pattern's edge interacting with the intensity gradient of an adjacent edge of a neighboring feature. This interaction consequently affects the development behavior of the pattern.

According to the present invention proximity effects are reduced by the addition of thin lines, referred to as intensity gradient leveling bars into the mask pattern. The leveling bars perform the function of adjusting the edge intensity gradients of isolated edges in the mask pattern, to match the edge intensity gradients of densely packed edges. Consequently, matching isolated edge gradients to densely packed edge gradients improves pattern transfer consistency. Leveling bars are placed parallel to isolated edges such that intensity gradient leveling occurs on all isolated edges of the mask pattern.

In addition, the leveling bars are designed to have a width significantly less than the resolution of the exposure tool. Consequently, leveling bars that are present in the mask pattern produce resist patterns that completely developed away when a nominal exposure energy is utilized during exposure of photoresist. In the preferred embodiment, the nominal exposure energy (En) to ensure that leveling bars do not remain in the resist pattern after development is approximately equal to 150 mJoules when utilizing an ASM-L 5500/60 optical stepper system with a Novalak-based positive photoresist process to target a 0.5 micron resolution feature. Since leveling bars may be automatically implemented in layout designs by way of a CAD software algorithm, the present invention offers a solution to proximity effects independent of circuit or layout design engineers.

In the preferred embodiment of the present invention, the width of the leveling bars is equal to one fifth (1/5) of the critical dimension for the circuit design. The critical dimension is typically close to the resolution limit of the exposure tool utilized during the lithographical process. For optimum edge intensity gradient modification, the leveling bars are placed at a distance equal to 1.1 times the critical dimension value from the desired edge for a clear field mask. If utilizing a dark field mask, the leveling bars are preferably located a distance equal to the critical dimension. Therefore, the present invention offers a process independent solution to proximity effects since placement and width of leveling bars are determined by critical dimension values.

The present invention is also applicable to all forms of photolithographical processes such as optical lithography, laser based deep UV lithography, non-laser based deep UV lithography, x-ray lithography, and particle beam based lithography.

BRIEF DESCRIPTION OF THE DRAWINGS

FIG. 1 is the mask test pattern showing isolated and densely packed features.

FIG. 2 is a graph comparing the final resist line widths for isolated and densely packed features, both having an original mask line width of 0.5 microns.

FIG. 3 is a graph illustrating the relative edge intensity gradients for isolated and densely packed lines.

Table 4 shows the optimum width and spacing for intensity leveling bars for the present invention for 0.4 micron and 0.5 micron critical dimension design rules.

FIG. 5A is the mask test pattern utilizing edge intensity leveling bars as described in the present invention.

FIG. 5B compares the edge intensity gradients for unleveled isolated edges, densely packed edges, and intensity leveled isolated edges as described by the present invention for the test pattern shown in FIG. 5A.

FIG. 6A is the mask test pattern utilized to determine the values shown in Tables 6B and 6C.

Table 6B shows line width and wall angle values for an isolated line, a densely packed line, and an intensity leveled isolated line at varying exposure energy levels.

Table 6C compares the line width and wall angle values in FIG. 6B.

FIG. 6D is the cross-sectional view of a resist line showing where measurements for line widths and wall angles in FIGS. 6B and 6C are taken.

FIG. 7A is the mask test pattern utilized to illustrate how edge intensity leveling bars develop in resist at varying levels of exposure energy.

FIG. 7B shows the cross-section of the resist pattern for an unleveled line, a leveled line and its associated leveling bar at varying exposure energy levels.

FIGS. 8A and 8B illustrates the placement of intensity leveling bars for various circuit patterns for clear and dark field masks.

DETAILED DESCRIPTION

An improved mask for substantially reducing the pattern transfer inconsistencies caused by proximity effects is disclosed. In the following description, numerous specific details are set forth, such as specific materials, line width dimensions, etc., in order to provide a thorough understanding of the present invention. It will be obvious, however, to one skilled in the art that these specific details need not be employed to practice the present invention. In other instances, well-known processing steps are not described in detail in order not to unnecessarily obscure the present invention.

FIG. 1 shows a mask test pattern having isolated and densely packed features. All of lines, 24–29, are 0.5 microns wide. The densely packed lines, lines 25–29 are spaced 0.5 microns apart, shown by 14. The distance between isolated line 24 and any other feature is at least 2 microns, shown by 15. Line 24 has two isolated edges 24A and lines 25 and 29 have one isolated edge each, 25A and 29A. With no proximity effect isolated line 24 would transfer the same as densely packed lines 25–29. However, FIG. 2 illustrates that lines 24–29 do not have the same final resist line widths.

FIG. 2 shows the the final resist line width for densely packed line 27 and isolated line 24 with respect to exposure energy. Line 20 in the graph shown in FIG. 2 indicates the original mask dimension of 0.5 microns for both of lines 24 and 27 for all exposure energies. Thus, FIG. 2 shows that even though isolated line 24 and densely packed line 27 have been designed to start with identical line widths, their final line widths do not match. As indicated by lines 21 and 22 in FIG. 2, the final resist line width for densely packed line 27 is consistently less than the line width for isolated line 24. This is true over a wide range of exposure energy levels.

Since proximity effects are embodied in the interaction of edge intensity gradients, another way to illustrate proximity effects in imaged features is to compare the edge intensity gradients for isolated and densely packed lines during exposure. FIG. 3 is a graph illustrating the relative edge intensity gradients for isolated edge 24A and densely packed edge 27B for the test pattern shown in FIG. 1. The slope of the edge intensity curve for the isolated line is 3.4 and the slope for the densely packed lines is 3.8. Therefore, densely packed lines produce a steeper edge gradient than isolated lines which will consequently effect the final line widths of lines 24 and 27 as shown in FIG. 2.

The present invention addresses the problems caused by proximity effects by matching the edge gradients for isolated and packed features. This is achieved by adding thin lines, referred to as edge intensity leveling bars, to the normal mask pattern adjacent to the isolated edges of lines. The optimum distance that the leveling bars are placed from the feature edge to be modulated is about 1.1 times the minimum spacing found in between densely packed features, (i.e. the critical dimension), for clear field mask patterns. A clear field mask is one which is defined as a mask having predominantly dark patterns on a transparent background (see FIG. 8A):

$$\text{optimum leveling bar distance} = 1.1 \times \text{critical dimension (clear field mask)}.$$

For dark field masks, the leveling bars are preferably located a distance equal to the width of the minimum opening; a dark field mask being defined as a mask having predominantly transparent openings on an opaque background (see FIG. 8B):

$$\text{optimum leveling bar distance} = \text{critical dimension (dark field mask)}.$$

In both clear and dark field masks the width of leveling bars is approximately equal to 1/5 of the critical dimension:

$$\text{leveling bar width} = (\text{critical dimension})/5.$$

Unlike process dependent prior art solutions to proximity effects, the present invention offers a means to solving proximity effects which is dependent on the critical dimension value for the circuit being designed and is therefore process independent. Thus, the present invention can easily be adjusted to fit 0.4 micron design rules. Table 4 shows the calculated dimensions and distances for intensity leveling bars for 0.4 and 0.5 micron critical dimension design rules.

The main concept of the present invention is to reduce proximity effects during pattern transfer by adjusting edge intensity gradients. Consequently, the specific values given in Table 4 for leveling bar width and spacing need not be employed to practice the present invention. Instead these specific values offer an optimum condition in which the present invention operates.

FIG. 5A shows a mask test pattern having leveling bars as disclosed in the present invention. Lines 30–34 are all designed to be 0.5 microns wide with 0.5 micron spacing. The pattern is designed such that three edge conditions occur for line 32. The section of line 32 designated as 32A illustrates a unleveled isolated edge, section 32B a densely packed edge, and section 32C is an isolated edge with two intensity leveling bars 35 and 36.

The edge intensity gradients are shown in FIG. 5B for each of the edge conditions, 32A, 32B, and 32C, shown in the test pattern of FIG. 5A. The slope of the edge intensity level for unleveled isolated edge 32A is 3.4. Whereas, the slope for the densely packed edge 32B and leveled edge 32C are much closer, 3.8 and 3.7 respectively. Thus, it is shown that edge intensity leveling bars can match edge intensity gradients for isolated and densely packed edges. Once edge intensity gradients are matched, the consistency of pattern transfer for isolated and packed is much improved.

The effect of edge intensity matching is also shown in Tables 6B and 6C. Tables 6B gives the measured value for resist line width and resist wall angles for isolated line 37, packed line 39 and leveled line 41 as shown in the test pattern in FIG. 6A. Since a resist line is not a one dimensional feature it is important to consider resist wall angles in determining consistencies between line widths for the three conditions shown in FIG. 6A. Therefore, to determine line widths and wall angles it is necessary to refer to FIG. 6D. FIG. 6D illustrates the cross-section of a resist line. To be consistent in measuring line widths, all line width measurements shown in Table 6B are taken at 20% of the total height 61 of the resist line from the bottom. Wall angles are extrapolated from 20% to 80% of the total height 61 of the resist line at the pattern edge.

The improvement of edge intensity leveling is more obvious in Table 6C where the line width of densely packed line 39 is compared to unleveled isolated line 37 and intensity leveled line 41. The comparison is performed by taking the absolute value of the difference between the line width value of packed line 39 and the line width value for each of isolated line 37 and intensity leveled line 41:

Delta=Absolute Value of ((line width 39)−(line width 37 or 41))

This subtraction gives the delta values between the packed and isolated lines and between packed and intensity leveled lines. The smaller the delta value the more closely the line widths match. Thus, a delta of zero would indicated no difference between line width values, i.e. a perfect match. The higher the delta value indicates a larger inconsistency between line width values. Table 6C shows that the delta values between packed line 39 and leveled line 41 are consistently less than the delta values between line 39 and unleveled isolated line 37. Also, the average delta value over an exposure energy range of 110 mJoules-210 mJoules is less for the packed/leveled comparison. The information shown in Table 6C shows that intensity leveled line 41 has line width values much closer to the line width values of densely packed line 39 when compared to unleveled line width values. In other words, by utilizing edge intensity leveling bars the final resist line width of an isolated line will closely match the final line width of a densely packed line. Whereas, the final resist line width of an isolated line without edge intensity leveling will not match.

Since it is undesirable to have additional lines in a circuit layout design and resist pattern, the present invention insures that leveling bars are not imageable under pattern transfer conditions. Consequently, the resist pattern of the leveling bars are completely developed away when a nominal exposure energy (En) is applied. In the preferred embodiment of the present invention the nominal exposure energy is 150 mJoules.

FIG. 7B shows the resist cross-section for the test pattern shown in FIG. 7A at varying exposure energies. Test pattern 7A is designed to illustrate the three edge conditions, i.e. isolated, packed, and leveled. Referring to FIG. 7A, line 43 has an isolated edge 43A and a packed edge 43B, line 44 has one packed edge 44B and one leveled edge 44C. Edge 44C is leveled by leveling bar 45. The exposure energy level for cross-section 46 of FIG. 7B is 70 mJoules. The hill between points "A" and "B" is the resist cross-section for line 43. The hill between points "B" and "C" is the resist cross-section for line 44 and the hill between points "C" and "D" is the resist cross-section for the leveling line 45. Thus, cross-section 46 shows that the leveling bar still develops into the resist pattern at an exposure energy of 70 mJoules. This would be expected because an exposure energy of 70 mJoules is significantly less the the nominal exposure energy suggested to eliminate leveling bars.

Cross-section 50 is the resist cross-section for the pattern shown in FIG. 7A at the nominal exposure energy of 150 mJoules. As can be seen the cross-sections for lines 43 and 44 are shown between the points "A" to "B" and "C" to "D". However, there is no trace of the leveling bar 45. Thus, the leveling bar is effective in edge intensity leveling and does not interfere with the final resist pattern.

Many prior art solutions to proximity effects have mostly been concerned with improving line width consistency. This is true because the critical line width dimension is crucial to IC designs. However, proximity effects can also cause variations in line length and corner rounding. Thus, another advantage of the present invention is that leveling bars are useful in intensity leveling all edges of pattern features since leveling bars can be generated to completely enclose all isolated pattern edges. FIGS. 8A and 8B shows various embodiments of the present invention for clear and dark field masks. In FIG. 8A, feature set 51 is a set of densely packed lines 52 with a leveling bar surrounding all of its isolated edges. Leveling bar 53 encompasses all of the isolated edges of feature set 51. It is not necessary to level some of the line edges in feature set 51 since not all of them are isolated. All of the edges are isolated for feature 54 consequently, leveling bar 55 completely encloses lines 56. Feature set 57 shows an example of a leveling bar that is placed between two isolated lines and thus levels both simultaneously. Lines 58 are situated such the distance for their leveling lines align with one another. Thus, line 59 serves the purpose of leveling both lines 58. Leveling bar 60 encompasses the isolated edges of lines 58. Finally, feature 60 is an example of how leveling bars can be used in conjunction with other feature compensating patterns such as serifs. Serifs 61 are commonly utilized to reduce corner rounding during pattern transfer. Leveling bar 62 surrounds both feature 60 and serifs 61.

FIG. 8B illustrates the placement of leveling bars when a dark field mask is utilized.

Although the present invention has been described in conjunction with certain embodiments, it is appreciated that the invention may be implemented in a variety of other ways. By way of example, the concept of the present invention is not strictly limited to semiconductor processes; it can be applied to any photolithographic processes. Consequently, it is to be understood that the particular embodiments shown and described by way of illustration are in no way intended to be considered limiting. Reference to the details of these embodiments is not intended to limit the scope of the claims which themselves recite only those features regarded as essential to the invention.

Thus, the present invention offers a simple solution for reducing proximity effects which is dependent only on the critical dimension of the circuit design.

We claim:

1. An improved mask for optically transferring a lithographic pattern corresponding to an integrated circuit (IC) from said mask onto a semiconductor substrate, said pattern including at least one feature having at least one edge, the improvement comprising:

at least one additional line, wherein said at least one additional line corresponds to, and is disposed on said mask at a predetermined distance away from, said at least one edge, said at least one additional line altering the edge intensity gradient of said at least one edge.

2. The improvement of claim 1 wherein said at least one additional line has a width sufficiently narrow so as not to be transferred onto said substrate.

3. The improvement of claim 2 wherein said least one feature has a certain minimum dimension and said width is less than one-half of said dimension.

4. The improvement of claim 3 wherein said width is approximately one-fifth of said dimension.

5. The improvement of claim 4 wherein said predetermined distance is approximately equal to said minimum dimension.

6. The improvement of claim 4 wherein said predetermined distance is approximately equal to 1.1 times said minimum dimension.

7. An improved mask for optically transferring a lithographic pattern corresponding to an integrated circuit (IC) from said mask onto a semiconductor substrate, said pattern including features each having associated edges, a first portion of said edges being spaced at a close proximity to one another such that pattern dependent variations occur due to optical diffraction, and a second portion of said edges being spaced relatively distant from any other edge of said features, the improvement comprising:

a plurality of additional lines, wherein each of said additional lines corresponds to, and is disposed on said mask at a predetermined distance away from, one of said edges of said second portion, said additional lines altering the edge intensity gradient of said second portion of said edges to approximate the edge intensity gradient of said first portion of said edges.

8. The improvement of claim 7 wherein said additional lines have a width sufficiently narrow so as not to be transferred onto said substrate.

9. The improvement of claim 8 wherein said features have a certain minimum dimension and said width is less than one-half of said dimension.

10. The improvement of claim 9 wherein said width is approximately one-fifth of said dimension.

11. The improvement of claim 10 wherein said predetermined distance is approximately equal to said minimum dimension.

12. The improvement of claim 10 wherein said predetermined distance is approximately equal to 1.1 times said minimum dimension.

13. An improved mask for lithographically transferring a pattern from a mask onto a surface, said pattern including features each having associated edges, a first portion of said edges being spaced at a close proximity to one another such that pattern dependent variations occur due to optical diffraction, and a second portion of said edges being spaced relatively distant from any other edge of said features, the improvement comprising:

a plurality of additional lines, wherein each of said additional lines corresponds to, and is disposed on said mask at a predetermined distance away from, one of said edges of said second portion, said additional lines altering the edge intensity gradient of said second portion of said edges to approximate the edge intensity gradient of said first portion of said edges.

14. The improvement of claim 13 wherein said additional lines have a width sufficiently narrow so as not to be transferred onto said substrate.

15. The improvement of claim 14 wherein said features have a certain minimum dimension and said width is less than one-half of said dimension.

16. The improvement of claim 15 wherein said width is approximately one-fifth of said dimension.

17. The improvement of claim 16 wherein said predetermined distance is approximately equal to said minimum dimension.

18. The improvement of claim 16 wherein said predetermined distance is approximately equal to 1.1 times said minimum dimension.

* * * * *